US 6,652,716 B2

(12) United States Patent
Kao et al.

(10) Patent No.: US 6,652,716 B2
(45) Date of Patent: Nov. 25, 2003

(54) APPARATUS AND METHOD FOR SELF-ALIGNING A COVER RING IN A SPUTTER CHAMBER

(75) Inventors: Chung-En Kao, Miaulih (TW); Min-Te Lai, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 88 days.

(21) Appl. No.: 10/052,842

(22) Filed: Oct. 19, 2001

(65) Prior Publication Data
US 2003/0075433 A1 Apr. 24, 2003

(51) Int. Cl.⁷ .......................... C23C 14/34; C23C 16/00
(52) U.S. Cl. .............. 204/192.1; 204/192.12; 204/298.11; 204/298.15; 204/298.23; 118/721; 118/729
(58) Field of Search ................... 118/721, 729; 427/569; 204/298.11, 298.15, 192.1, 192.12, 298.23, 298.29; 156/345.3, 345.51; 216/67

(56) References Cited

U.S. PATENT DOCUMENTS 5,860,640 A * 1/1999 Marohl et al. .............. 118/729

FOREIGN PATENT DOCUMENTS

EP          1 134 791       * 9/2001

* cited by examiner

Primary Examiner—Rodney G. McDonald
(74) Attorney, Agent, or Firm—Tung & Associates

(57) ABSTRACT

An apparatus and a method for self-aligning a cover ring onto a wafer pedestal in a physical vapor deposition chamber are described. The apparatus for self-aligning a cover ring to a wafer pedestal includes a wafer pedestal in the shape of a circular disk equipped on an outer periphery of the disk at least two, and preferably four, male alignment members such as protruding tabs; and a cover ring of annular shape that has an inwardly, horizontally extending lip and at least one downwardly, vertically extending lip equipped on an inner periphery at least two, and preferably four, female alignment members such as recessed slots that are adapted for receiving the at least two male alignment members when the wafer pedestal is raised to engage the cover ring.

20 Claims, 3 Drawing Sheets

APPARATUS AND METHOD FOR SELF-ALIGNING A COVER RING IN A SPUTTER CHAMBER

FIELD OF THE INVENTION

The present invention generally relates to an apparatus and a method for operating a sputter chamber equipped with a cover ring and a wafer pedestal and more particularly, relates to an apparatus and a method for self-aligning a cover ring to a wafer pedestal in a sputter chamber.

BACKGROUND OF THE INVENTION

Physical vapor deposition (PVD) or sputter deposition is a frequently used processing technique in the manufacturing of semiconductor devices that involves the deposition of a metallic layer on the surface of a semiconductor device. The physical vapor deposition technique is more frequently known as a sputtering technique. In more recently developed semiconductor fabrication processes, the sputtering technique is used to deposit metallic layers of tungsten or titanium tungsten as contact layers.

In a sputtering process, inert gas particles such as those of argon or nitrogen, are first ionized in an electric field to produce a gas plasma and then attracted toward a source or a target where the energy of the gas particles physically dislodges, i.e., sputters off, atoms of the metallic or other source material. The sputtering technique is very versatile in that various materials can be deposited utilizing not only RF but also DC power sources.

In a typical sputter chamber, the major components utilized include a stainless steel chamber that is vacuum-tight and is equipped with a helium leak detector, a pump that has the capacity to reduce the chamber pressure to at least $10^{-6}$ torr or below, various pressure gauges, a sputter source or target, a RF or DC power supply, a wafer holder, a chamber shield and a clamp ring. The sputter source is normally mounted on the roof of the chamber such that it faces a wafer holder positioned in the center of the chamber facing each other. The sputter source utilized can be a W or TiW disc for a process in which W or TiW is sputtered. A typical sputter chamber is that supplied by the Applied Materials, Inc. of Santa Clara, Calif. under the trade name of Endura® 5500. In some of the sputter chambers, the wafer holder is structured as a pedestal which includes an internal resistive heater.

One of the more important component in the sputter chamber is the clamp ring which serves two purposes during a sputter process. The first purpose is to clamp the wafer to the pedestal heater. The clamp ring holds the wafer in place on the pedestal when a positive gas pressure is applied between the heater and the pedestal such that heat can be efficiently conducted from the heater to the wafer. The second purpose served by the clamp ring is to allow a predetermined flow of argon to leak from under the wafer into the sputter chamber. The clamp ring is generally constructed in a circular shape with an oriented cut-out to match a wafer's flat contour. A hood is built into the clamp ring and is used for shadowing purpose to protect the lip of the clamp ring from being coated by the sputtered metal particles. The lip portion also allows the force of the clamp ring to be evenly distributed around the wafer.

A cross-sectional view of a typical sputter chamber 10 is shown in FIG. 1. Sputter chamber 10 is constructed by a stainless steel chamber body 12 that is vacuum-tight, a sputter target 16 of W, TiW or Sn, a wafer holder 20 equipped with a heater 22, a wafer lift mechanism 24, a wafer port 28, a pumping port 32, a clamp ring 30 and a chamber shield 34. A DC power supply 25 is connected to a target 21 and a conductive part of the chamber, such as the chamber wall 18 or chamber shield 34, thereby establishing a voltage potential between the grounded chamber wall 18 and the target 21. A DC bias circuit 23 is connected to the clamping ring and thus applies a DC bias to the wafer (not shown). A perspective view of the clamp ring 30 and the chamber shield 34 is shown in FIG. 1A. An enlarged, partial cross-sectional view of the clamp ring 30 and the chamber shield 34 is shown in FIG. 1B. The hood 36 of the clamp ring 30 protects the tip 38 from being coated by the sputtered particles.

As shown in FIG. 1, the chamber shield 34 is another important component in the sputter chamber 10. It forms a seal between the clamp ring 30 and the chamber body 12 such that sputtered particles from the sputter target 16 do not contaminate the chamber wall 18 during a sputtering process. It should be noted that, during the sputtering process, the wafer pedestal 20 is in a raised position with the tip portion 38 of the clamp ring 30 touching the heater 22 on the pedestal 20. In order to achieve a tight seal from the chamber wall 18, a small gap 40 is normally maintained between the clamp ring 30 and the chamber shield 34.

In a typical metal sputtering process where a Ti, W, TiW, Sn or other metal target is used in the sputter chamber, the emission of sputtered particles of the metals is shaped with a forward cosine distribution such that a more desirable deposition process in which metal particles are deposited uniformly at the center and the edge of the wafer can be achieved.

In another typical metal sputtering chamber, instead of the clamp ring 30 shown in FIGS. 1~1B, a cover ring 42 is used. The cover ring 42, as shown in FIG. 2C, does not clamp onto the surface of wafer 44. The cover ring 42 is equipped with alignment mark shields 46 which extend radially inwardly from an inner periphery 48 of the cover ring 42. The function of the alignment mark shield 46 is to cover the alignment marks (not shown) located on the top surface of the wafer 44 and to prevent the deposition of metal particles thereon. In this configuration, when the wafer lifter 24 raises up with a wafer 44 mounted on top to meet the cover ring 42, the cover ring 42 must be properly seated on the wafer pedestal 20 in order to provide proper shielding of the alignment marks. Such alignment cannot be ensured when the sputter chamber has been operated after a length of time and when the sputter chamber has been cleaned during a preventive maintenance procedure. When the cover ring 42 is not properly seated, or aligned with the wafer pedestal 20, excess metal particle deposition between the cover ring 42 and the chamber shield 34 may cause arcing between the two components. Moreover, metal particles may further penetrate through gaps formed between the two components and deposit on the chamber bottom which may cause serious contamination problem.

It is therefore an object of the present invention to provide an apparatus for self-aligning a cover ring to a wafer pedestal in a sputter chamber that does not have the drawbacks or shortcomings of the conventional apparatus.

It is another object of the present invention to provide an apparatus for self-aligning a cover ring to a wafer pedestal in a sputter chamber such that the alignment marks are properly shielded during sputtering.

It is a further object of the present invention to provide an apparatus for self-aligning a cover ring to a wafer pedestal in a sputter chamber by providing at least two male alignment members on the outer periphery of the wafer pedestal.

It is another further object of the present invention to provide an apparatus for self-aligning a cover ring to a wafer pedestal in a sputter chamber by engaging at least two male alignment members on the wafer pedestal to at least two female alignment member on the cover ring.

It is still another object of the present invention to provide an apparatus for self-aligning a cover ring to a wafer pedestal in a sputter chamber by providing at least two protruding tabs on the wafer pedestal for engaging at least two recessed slots on the cover ring.

It is yet another object of the present invention to provide a method for self-aligning a cover ring to a wafer pedestal in a sputter chamber by engaging at least two male alignment members on the wafer pedestal to at least two female alignment members on the cover ring.

SUMMARY OF THE INVENTION

In accordance with the present invention, an apparatus and a method for self-aligning a cover ring to a wafer pedestal in a sputter chamber are provided.

In a preferred embodiment, an apparatus for self-aligning a cover ring to a wafer pedestal in a sputter chamber can be provided which includes a wafer pedestal in the shape of a circular disk equipped on an outer periphery of the disk at least two male alignment members and a cover ring of annular shape that has an inwardly, horizontally extending lip and at least one downwardly, vertically extending lip equipped on an inner periphery at least two female alignment members adapted for receiving the at least two male alignment members when the wafer pedestal is raised to meet the cover ring.

In the apparatus for self-aligning a cover ring in a sputter chamber, the at least two male alignment members may be protruding tabs, while the at least two female alignment members may be recessed slots. The protruding tabs may be L-shaped members with one leg of the "L" mechanically fastened to a recess provided in the outer periphery of the circular disk, or one leg of the "L" may be fastened to a recess provided in the outer periphery of the circular disk by screw means. The recessed slots are each provided with three tapered surfaces forming a larger opening at the bottom for receiving and guiding the protruding tabs into the recessed slots. The cover ring may further include two downwardly, vertically extending lips with the at least two female alignment members formed on an inner periphery of an inner lip. The wafer pedestal may further include four male alignment members and the cover ring may further include four female alignment members. One of the four male alignment members and a corresponding one of the four female alignment members may have a width that is larger than the other male alignment members and the other female alignment members.

The present invention is further directed to a method for self-aligning a cover ring with a wafer pedestal in a sputter chamber which can be carried out by the operating steps of first providing a wafer pedestal in the shape of a circular disk equipped on an outer periphery of the disk at least two male alignment members; providing a cover ring of annular shape that has an inwardly, horizontally extending lip and at least one downwardly, vertically extending lip equipped on an inner periphery at least two female alignment members adapted for receiving the at least two male alignment members; and raising the wafer pedestal to meet the cover ring until the at least two male alignment members engage the at least two female alignment members.

The method for self-aligning a cover ring with a wafer pedestal in a sputter chamber may further include the step of providing four male alignment members and four corresponding female alignment members. The method may further include a step of mechanically mounting the at least two male alignment members to the outer periphery of the circular disk. The method may further include the step of providing the at least two male alignment members in L-shaped protruding tabs, or the step of mechanically fastening one leg of the L-shaped protruding tab into a recess formed in the outer periphery of the circular disk, or the step of forming the at least two female alignment members in recessed slots. The method may further include the step of forming the recessed slots with three tapered surfaces forming a larger opening at the bottom so as to guide and receive the at least two male alignment members.

The present invention is still further directed to an apparatus for self-aligning a cover ring to a wafer pedestal in a sputter chamber that includes a wafer pedestal in the shape of a circular disk equipped on an outer periphery of the disk at least two protruding tabs, and a cover ring of annular shape that has an inwardly, horizontally extending lip and at least one downwardly, vertically extending lip equipped on an inner periphery at least two recessed slots adapted for receiving the at least two protruding tabs when the wafer pedestal is raised to meet the cover ring.

The apparatus for self-aligning a cover ring to a wafer pedestal in a sputter chamber may further include four protruding tabs on the wafer pedestal and four recessed slots on the cover ring. The at least two protruding tabs may be formed of L-shape with one leg of the "L" mechanically fastened to a recess provided in the outer periphery of the circular disk. One of the four protruding tabs and a corresponding one of the four recessed slots may have a width that is larger than the other protruding tabs and the other recessed slots for achieving wafer orientation.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for self-aligning a cover ring to a wafer pedestal in a physical vapor deposition chamber, i.e. in a sputter chamber, such that the wafer pedestal and the cover ring are always aligned to protect the alignment marks on the wafer surface during a sputtering operation.

The apparatus of the present invention includes a wafer pedestal that is equipped with male alignment members, and a cover ring that is equipped with female alignment members. For instance, the wafer pedestal is provided in the shape of a circular disk equipped on an outer periphery of the disk at least two, and preferably four, male alignment members or protruding tabs. The protruding tabs may be provided advantageously in L-shaped tab with one leg of the "L" mechanically fastened to a recess in the periphery of the circular disk.

The cover ring of the present invention apparatus may be provided in an annular shape that has an inwardly, horizontally extending lip and at least one, and preferably two, downwardly, vertically extending lip equipped on an inner periphery at least two female alignment members, such as recessed slots, adapted for receiving the at least two male alignment members on the wafer pedestal when the pedestal is raised to engage the cover ring.

The at least two recessed slots may be advantageously four recessed slots to engage the four protruding tabs provided on the wafer pedestal. The recessed slots are preferably provided with three tapered surfaces forming a larger opening at the bottom for receiving and guiding the protruding tabs into the recessed slots during engagement. Optionally, one of the four protruding slots and a corresponding one of the four recessed slots may have a width that is larger than the other protruding tabs and the other recessed slots for easy orientation of the wafer during the sputtering operation.

Figure 1:
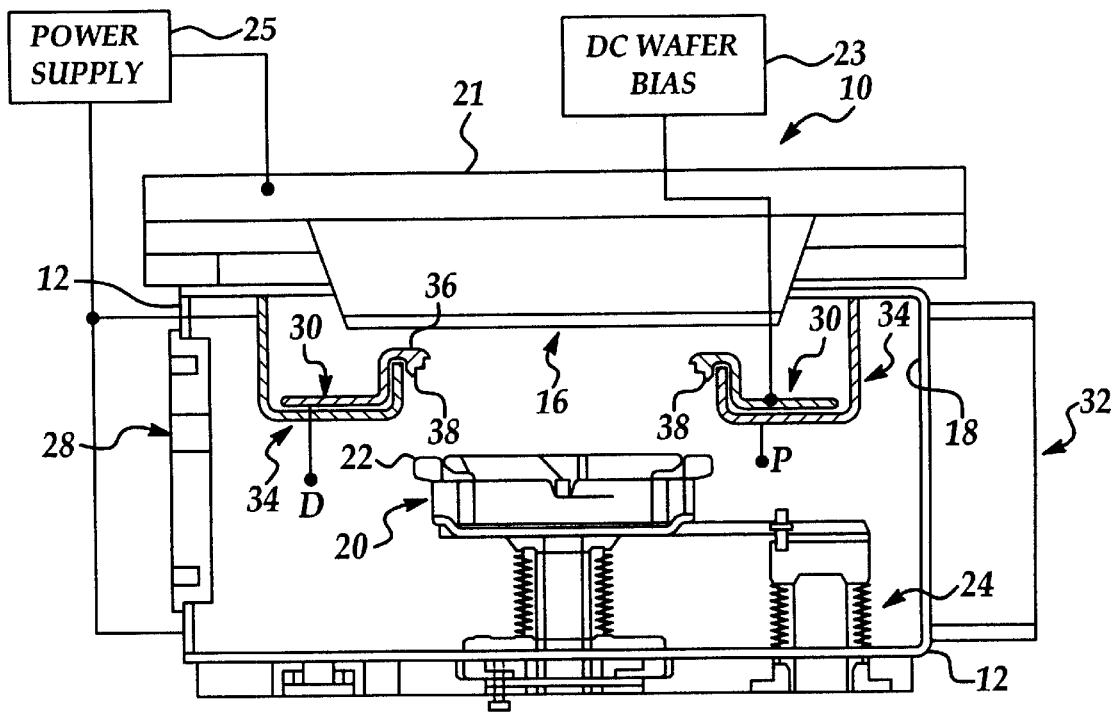
FIG. 1 is a cross-sectional view of a conventional physical vapor deposition chamber that is equipped with a wafer pedestal and a clamp ring.
Figure 1A:
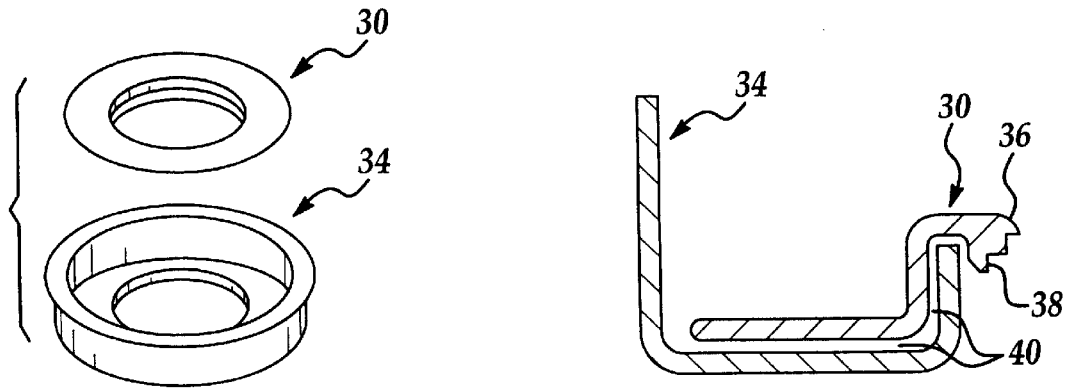
FIG. 1A is a perspective view of the chamber shield and the clamp ring of FIG. 1.
Figure 1B:
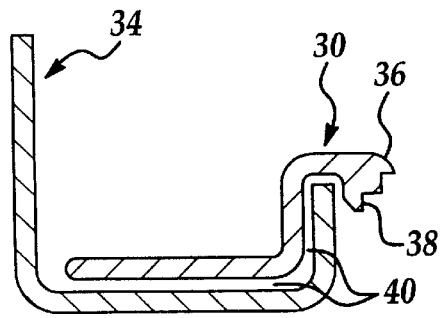
FIG. 1B is an enlarged, cross-sectional view of the chamber shield and the clamp ring of FIG. 1.
Figure 2A:
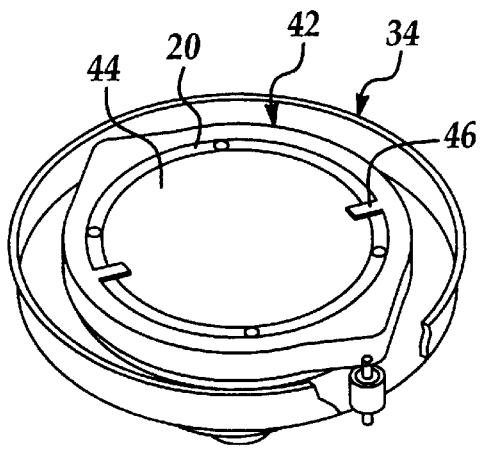
FIG. 2A is a perspective view of a conventional cover ring assembled to a wafer pedestal and a chamber shield.
Figure 2B:
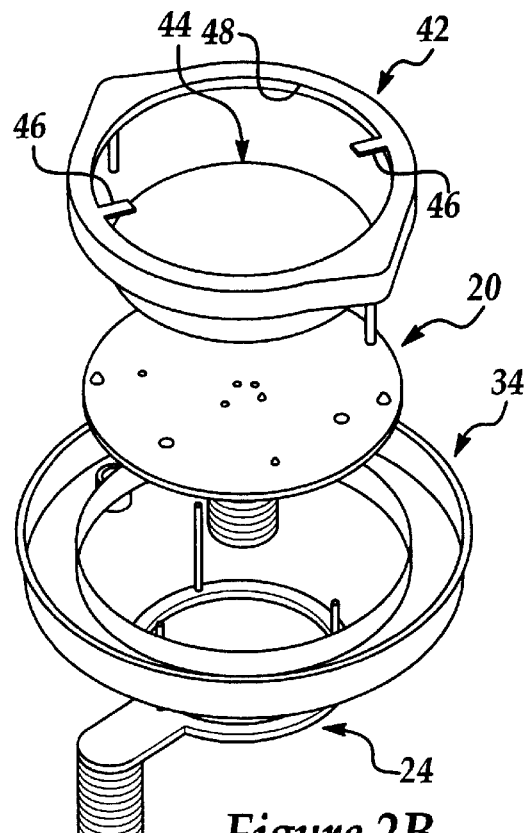
FIG. 2B is a perspective view of the components of the conventional cover ring, a wafer pedestal, a chamber shield and a wafer lifter.
Figure 2C:
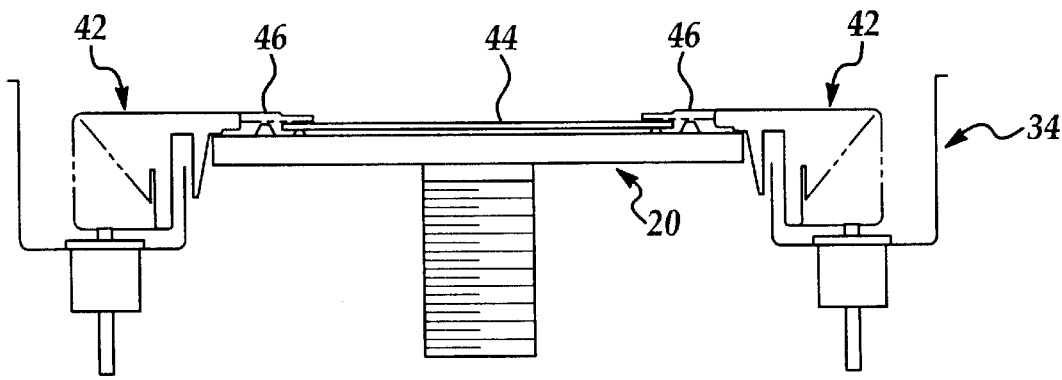
FIG. 2C is an enlarged, cross-sectional view of the conventional cover ring and the wafer pedestal of FIG. 2B.
Figure 3A:
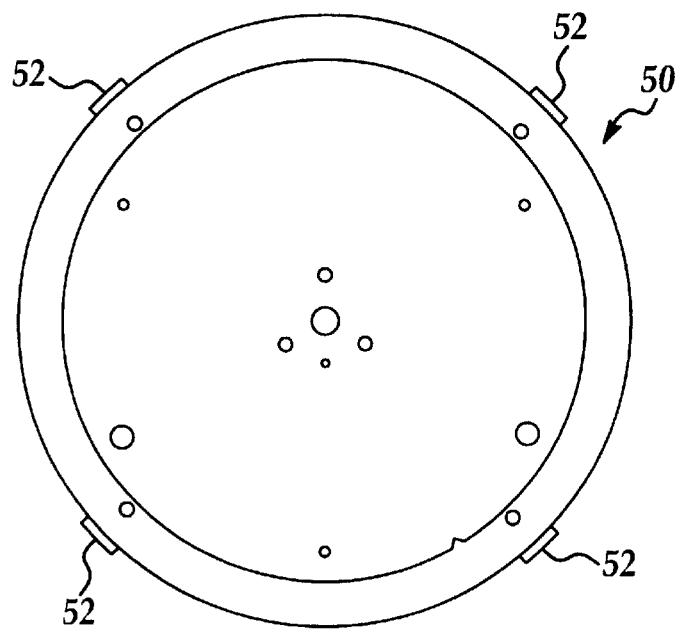
FIG. 3A is a plane view of the present invention wafer pedestal illustrating four protruding tabs.
Figure 3B:
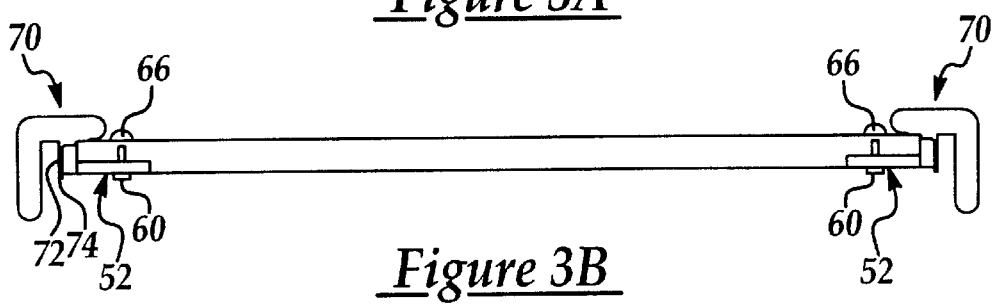
FIG. 3B is a cross-sectional view of the present invention wafer pedestal equipped with the protruding tabs and the cover ring equipped with the recessed slots engaged together.

Referring now to FIGS. 3A and 3B, wherein a plane view and a cross-sectional view of the present invention wafer pedestal and the wafer pedestal/cover ring assembly are shown, respectively. In FIG. 3A, the present invention wafer pedestal 50 is provided with four male alignment members, or four protruding tabs 52, while an enlarged, perspective view of the protruding tab 52 in relation to the wafer pedestal 50 is shown in FIG. 3D. It is seen that the protruding tab 52 is advantageously provided in an L-shape with one leg 54 of the "L" mechanically engaging a recess 56 provided in a bottom surface 58 of the wafer pedestal 50. The L-shaped protruding tab 52 can be advantageously fastened to the wafer pedestal 50 by mechanical means, such as by a screw (not shown) through a mounting hole 62 in the protruding tab 52 and a mounting hole 64 in the wafer pedestal 50. Other mounting means, such as frictional engagement or tongue-and-groove engagement may also be utilized. A screw 60 used to mechanically fasten the protruding tab 52 to the wafer pedestal 50, is shown in FIG. 3B in a cross-sectional view. Also shown in FIG. 3B, on top of the wafer pedestal 50, is a wafer positioning guide 66 which is mounted on the top surface in a circular manner to locate a wafer (not shown) to be mounted thereon.

Figure 3C:
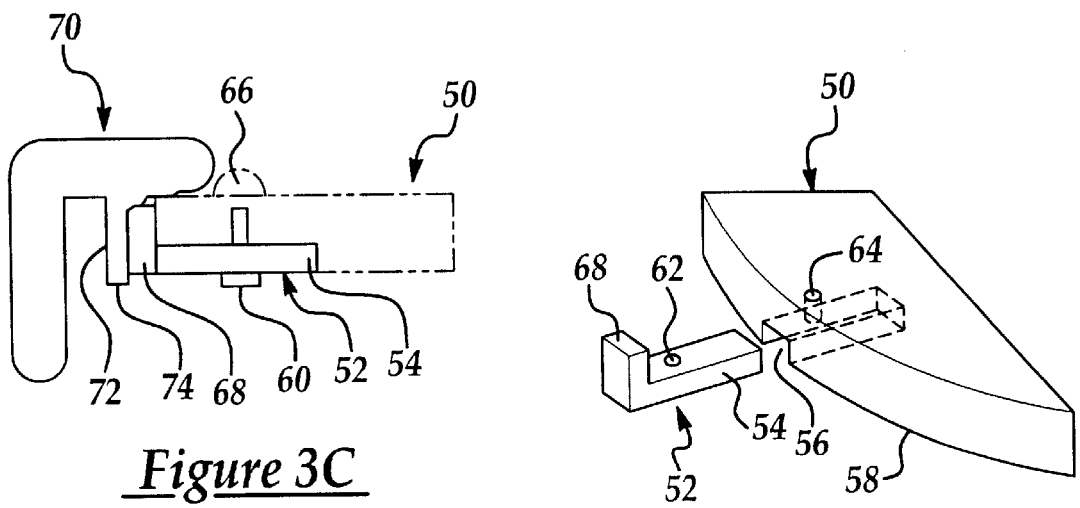
FIG. 3C is an enlarged, cross-sectional view of the present invention cover ring and the wafer pedestal engaged together.
Figure 3D:
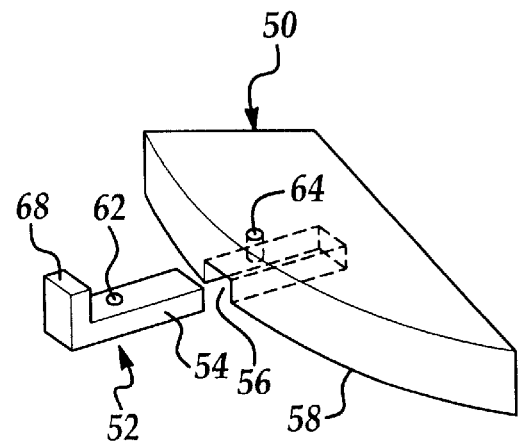
FIG. 3D is a perspective view of a present invention protruding tab of L-shape fastened by one leg to a recess in the wafer pedestal.

A present invention cover ring 70 is also shown in FIGS. 3B and 3C. The cover ring 70, as shown in an enlarged view in FIG. 3C, further includes a tapered surface 72 in an downwardly extending lip 74. It should be noted that the tapered surface 72 assists in guiding and receiving the upwardly standing leg 68 of the protruding tab 52 when the wafer pedestal 50 is pushed up to engage the cover ring 70. The tapered surface 72 is provided in all three surfaces of the recessed slot in the downwardly extending lip 74 of the cover ring 70. It should be noted that, in FIG. 3C, only the tapered surface 72 in one dimension is shown, the tapered surfaces in the other two dimensions are not shown.

The present invention apparatus and method for self-aligning a cover ring to a wafer pedestal in a physical deposition chamber have therefore been amply described in the above descriptions and in the appended drawings of FIGS. 3A–3D.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An apparatus for self-aligning a cover ring in a sputter chamber, comprising:
   a wafer pedestal in the shape of a circular disk equipped on an outer periphery of the disk at least two male alignment members of protruding tabs, and
   a cover ring of annular shape having an inwardly, horizontally extending lip equipped on an inner periphery at least two female alignment members of recessed slots adapted for receiving said at least two male alignment members when said wafer pedestal is raised to engage said cover ring, wherein said recessed slots are each provided with three tapered surfaces forming a larger opening at the bottom for receiving and guiding said protruding tabs into said recessed slots.

2. An apparatus for self-aligning a cover ring in a sputter chamber according to claim 1, wherein said protruding tabs are L-shape members with one leg of the "L" mechanically fastened to a recess provided in said outer periphery of the circular disk.

3. An apparatus for self-aligning a cover ring in a sputter chamber according to claim 1, wherein said protruding tabs are L-shaped members with one leg of the "L" fastened to a recess provided in said outer periphery of the circular disk by screw means.

4. An apparatus for self-aligning a cover ring in a sputter chamber according to claim 1, wherein said cover ring further comprises two downwardly, vertically extending lips with said at least two female alignment members formed on an inner periphery of an inner lip.

5. An apparatus for self-aligning a cover ring in a sputter chamber according to claim 1, wherein said wafer pedestal comprises four male alignment members and said cover ring comprises four female alignment members.

6. An apparatus for self-aligning a cover ring in a sputter chamber comprising:
   a wafer pedestal in the shape of a circular disk equipped on an outer periphery of the disk at least two male alignment members, and
   a cover ring of annular shape having an inwardly, horizontally extending lip equipped on an inner periphery at least two female alignment members adapted for receiving said at least two male alignment members when said wafer pedestal is raised to engage said cover ring, wherein said wafer pedestal comprises four male alignment members and said cover ring comprises four female alignment members, one of said four male alignment members and one of said four female alignment members have a width that is larger than said other male alignment members and said other female alignment members.

7. An apparatus for self-aligning a cover ring in a sputter chamber according to claim 6, wherein said at least two male alignment members are protruding tabs and said at least two female alignment members are recessed slots.

8. An apparatus for self-aligning a cover ring in a sputter chamber according to claim 7, wherein said protruding tabs are L-shape members with one leg of the "L" mechanically fastened to a recess provided in said outer periphery of the circular disk.

9. An apparatus for self-aligning a cover ring in a sputter chamber according to claim 7, wherein said protruding tabs are L-shaped members with one leg of the "L" fastened to a recess provided in said outer periphery of the circular disk by screw means.

10. An apparatus for self-aligning a cover ring in a sputter chamber according to claim 7, wherein said recessed slots are each provided with three tapered surfaces forming a larger opening at the bottom for receiving and guiding said protruding tabs into said recessed slots.

11. A method for self-aligning a cover ring with a wafer pedestal in a sputter chamber comprising the steps of:

providing a wafer pedestal in the shape of a circular disk equipped on an outer periphery of the disk at least two male alignment members;

providing a cover ring of annular share having an inwardly, horizontally extending lip and at least one downwardly, vertically extending lip;

forming on an inner periphery at least two female alignment members in recessed slots with three tapered surfaces forming a larger opening at the bottom so as to guide and receive at least two male alignment members; and raising said wafer pedestal into said cover ring until said at least two male alignment members engage said at least two female alignment members.

12. A method for self-aligning a cover ring with a wafer pedestal in a sputter chamber according to claim 11 further comprising the step of providing four male alignment members and four corresponding female alignment members.

13. A method for self-aligning a cover ring with a wafer pedestal in a sputter chamber according to claim 11 further comprising the step of mechanically mounting said at least two male alignment members to said outer periphery of the circular disk.

14. A method for self-aligning a cover ring with a wafer pedestal in a sputter chamber according to claim 11 further comprising the step of providing said at least two male alignment members in L-shaped protruding tabs.

15. A method for self-aligning a cover ring with a wafer pedestal in a sputter chamber according to claim 14 further comprising the step of mechanically fastening one leg of the L-shaped protruding tab into a recess formed in said outer periphery of the circular disk.

16. A method for self-aligning a cover ring with a wafer pedestal in a sputter chamber according to claim 11 further comprising the step of forming said at least two female alignment members in recessed slots.

17. An apparatus for self-aligning a cover ring to a wafer pedestal in a sputter chamber comprising:

a wafer pedestal in the shape of a circular disk equipped on an outer periphery of the disk at least two protruding tabs, and a cover ring of annular share having an inwardly, horizontally extending lip and at least one downwardly, vertically extending lip equipped on an inner periphery at least two recessed slots adapted for receiving said at least two protruding tabs when said wafer pedestal is raised to engage said cover ring, wherein said recessed slots are each provided with three tapered surfaces forming a larger opening at the bottom for receiving and guiding said protruding tabs into said recessed slots.

18. An apparatus for self-aligning a cover ring to a wafer pedestal in a sputter chamber according to claim 17 further comprising four protruding tabs on said wafer pedestal and four recessed slots on said cover ring.

19. An apparatus for self-aligning a cover ring to a wafer pedestal in a sputter chamber according to claim 18, wherein one of said four protruding tabs and a corresponding one of said four recessed slots have a width that is larger than said other protruding tabs and said other recessed slots.

20. An apparatus for self-aligning a cover ring to a wafer pedestal in a sputter chamber according to claim 17.

* * * * *